(12) United States Patent
Kawamoto et al.

(10) Patent No.: US 11,791,124 B2
(45) Date of Patent: Oct. 17, 2023

(54) CHARGED PARTICLE BEAM APPARATUS

(71) Applicant: Hitachi High-Technologies Corporation, Tokyo (JP)

(72) Inventors: Yuta Kawamoto, Tokyo (JP); Akira Ikegami, Tokyo (JP); Yasushi Ebizuka, Tokyo (JP); Nobuo Fujinaga, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 297 days.

(21) Appl. No.: 17/230,650

(22) Filed: Apr. 14, 2021

(65) Prior Publication Data

US 2021/0233738 A1 Jul. 29, 2021

Related U.S. Application Data

(62) Division of application No. 16/782,521, filed on Feb. 5, 2020, now abandoned.

(30) Foreign Application Priority Data

Mar. 11, 2019 (JP) ................................. 2019-043298

(51) Int. Cl.
*H01J 37/10* (2006.01)
*H01J 37/153* (2006.01)
*H01J 37/147* (2006.01)

(52) U.S. Cl.
CPC ............ *H01J 37/153* (2013.01); *H01J 37/10* (2013.01); *H01J 37/1472* (2013.01); *H01J 2237/0473* (2013.01); *H01J 2237/1534* (2013.01)

(58) Field of Classification Search
CPC ...... H01J 37/153; H01J 37/10; H01J 37/1472; H01J 2237/0473; H01J 2237/1534;
(Continued)

(56) References Cited

U.S. PATENT DOCUMENTS

| 5,708,274 A | 1/1998 | Langner et al. |
| 2006/0033037 A1 | 2/2006 | Kawasaki et al. |

(Continued)

FOREIGN PATENT DOCUMENTS

| JP | 2010-251218 A | 11/2010 |
| JP | 2014-53074 A | 3/2014 |

OTHER PUBLICATIONS

U.S. Office Action issued in U.S. Appl. No. 16/782,521 dated Jun. 2, 2021 (six (6) pages).

(Continued)

*Primary Examiner* — Sean M Luck
(74) *Attorney, Agent, or Firm* — Crowell & Moring LLP

(57) ABSTRACT

An object of the present disclosure is to provide a charged particle beam apparatus that can quickly find a correction condition for a new aberration that is generated in association with beam adjustment. In order to achieve the above object, the present disclosure proposes a charged particle beam apparatus configured to include an objective lens (7) configured to focus a beam emitted from a charged particle source and irradiate a specimen, a visual field movement deflector (5 and 6) configured to deflect an arrival position of the beam with respect to the specimen, and an aberration correction unit (3 and 4) disposed between the visual field movement deflector and the charged particle source, in which the aberration correction unit is configured to suppress a change in the arrival position of the beam irradiated under different beam irradiation conditions.

3 Claims, 11 Drawing Sheets

(58) Field of Classification Search
CPC ......... H01J 2237/153; H01J 2237/1532; H01J 2237/1536
See application file for complete search history.

(56) References Cited

U.S. PATENT DOCUMENTS

| | | |
|---|---|---|
| 2012/0012747 A1 | 1/2012 | Lazar et al. |
| 2014/0021366 A1 | 1/2014 | Dohi et al. |
| 2015/0357155 A1 | 12/2015 | Dohi et al. |
| 2015/0364290 A1 | 12/2015 | Enyama et al. |
| 2016/0217967 A1 | 7/2016 | Dohi et al. |
| 2016/0300690 A1 | 10/2016 | Ikegami et al. |
| 2016/0351371 A1 | 12/2016 | Li et al. |
| 2017/0125210 A1 | 5/2017 | Henstra et al. |
| 2017/0162362 A1* | 6/2017 | Yoshida ................. H01J 37/153 |
| 2017/0236681 A1 | 8/2017 | Morishita |
| 2018/0190469 A1 | 7/2018 | Cheng et al. |
| 2018/0233320 A1* | 8/2018 | Ikegami ................. H01J 37/04 |
| 2018/0366295 A1 | 12/2018 | Morishita |

OTHER PUBLICATIONS

United States Non-Final Office Action issued in U.S. Appl. No. 17/462,455 dated Apr. 7, 2023 (eight (8) pages).

* cited by examiner

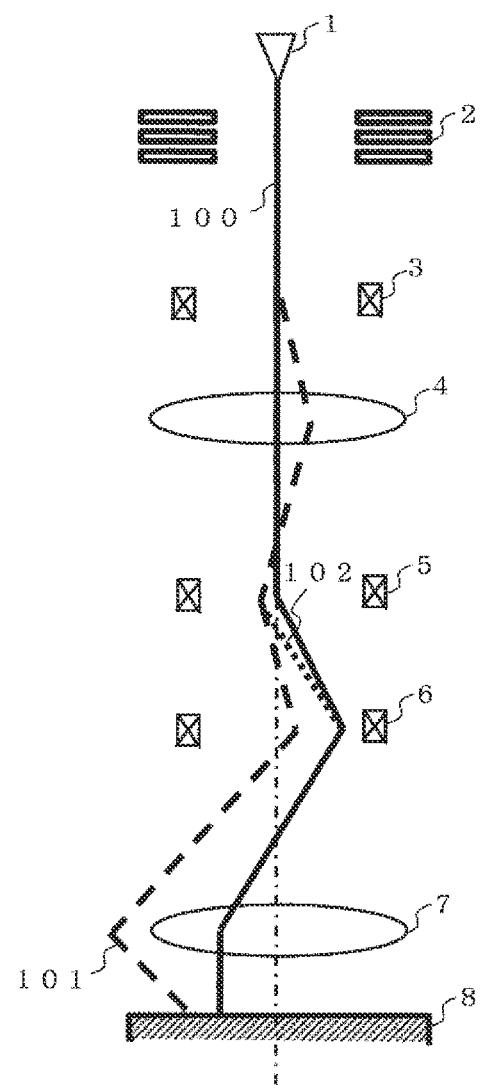
[FIG. 1]

[FIG. 2]
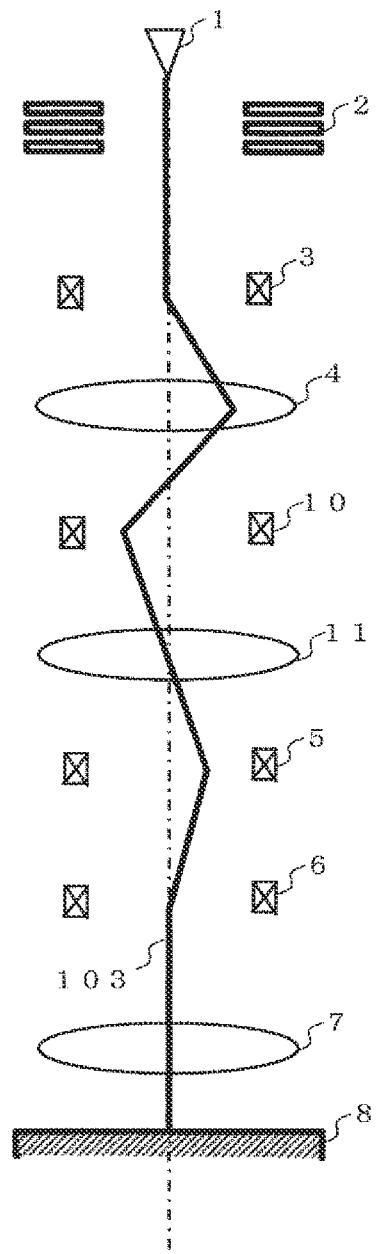

[FIG. 3]
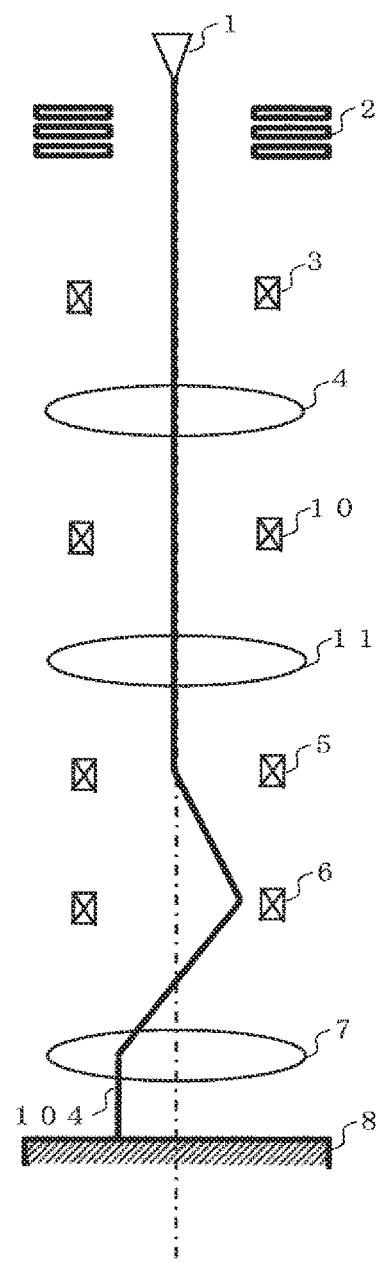

[FIG. 4]
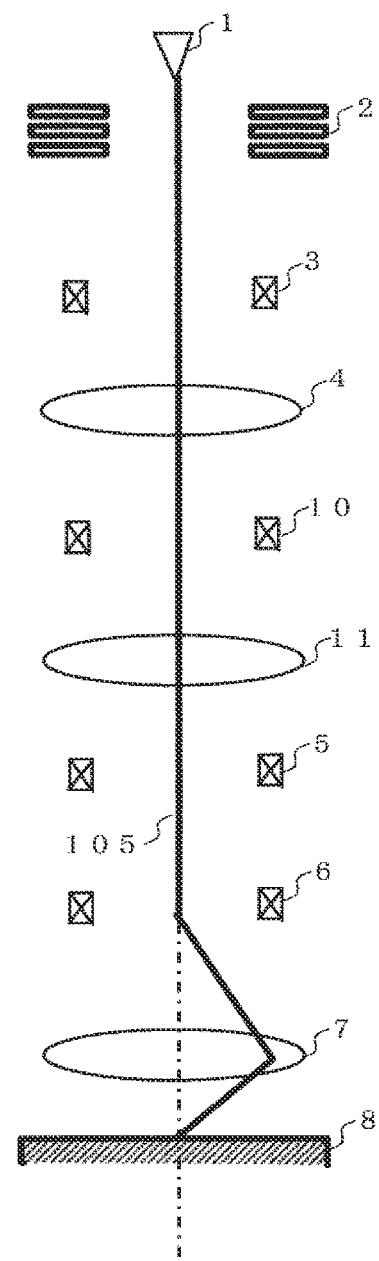

[FIG. 5]
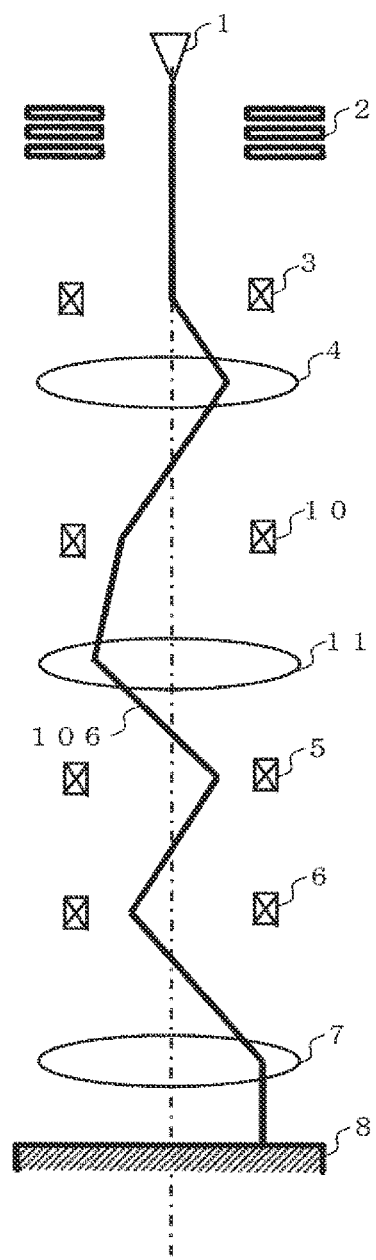

[FIG. 6]
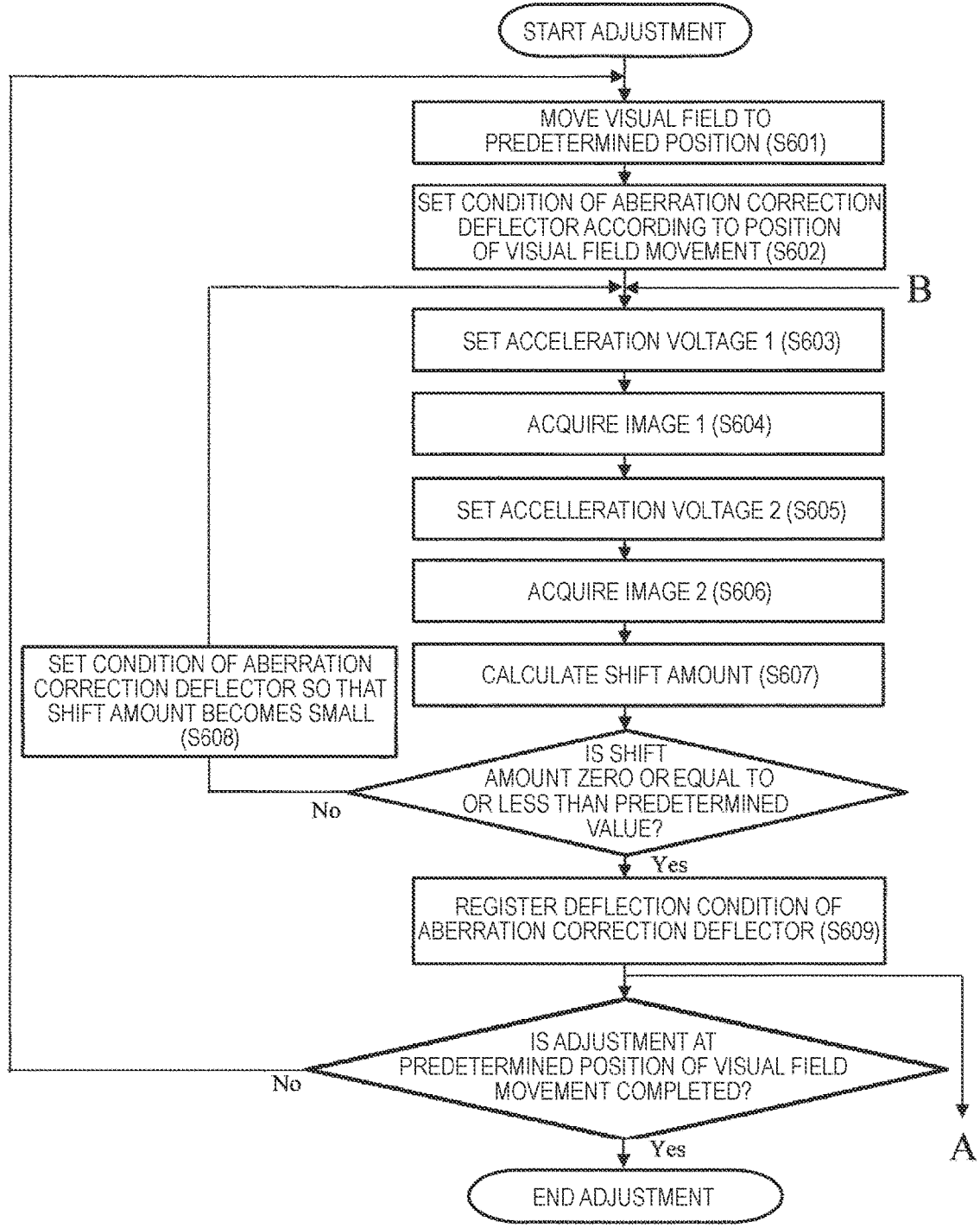

[FIG. 7]
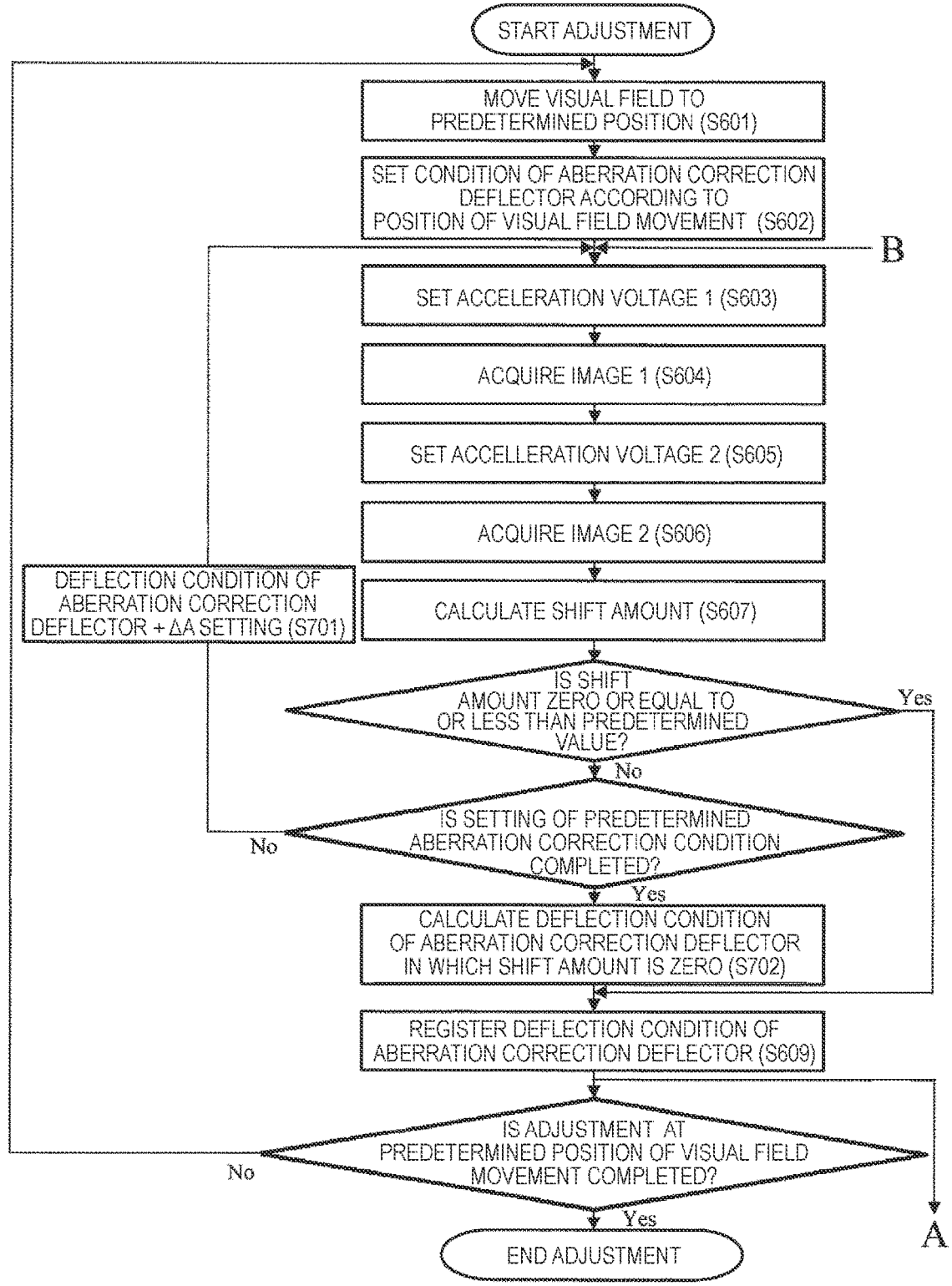

[FIG. 8]
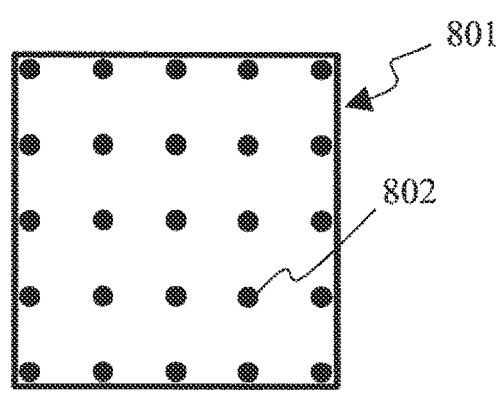
[FIG. 9]
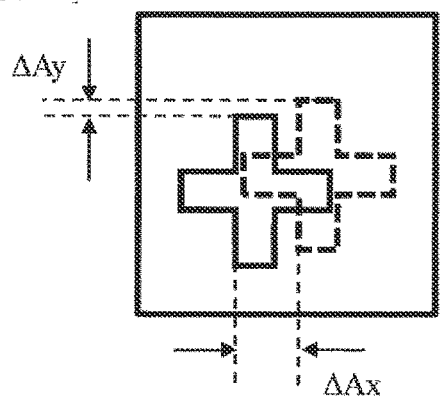
(a) IMAGE SHIFT OBTAINED BY CHANGING ACCELERATION VOLTAGE IN STATE OF ABERRATION CORRECTION DEFLECTOR CONDITION A
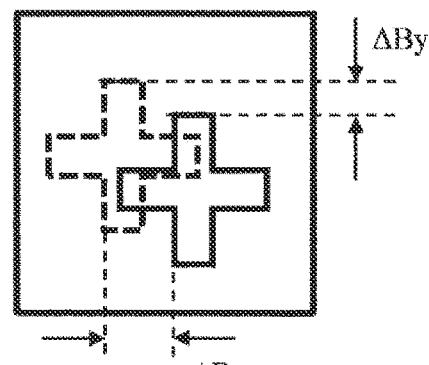
(b) IMAGE SHIFT OBTAINED BY CHAGING ACCLERATION VOLTAGE IN STATE OF ABERRATION CORRECTION DEFLECTOR CONDITION B (+ΔA)

[FIG. 10]
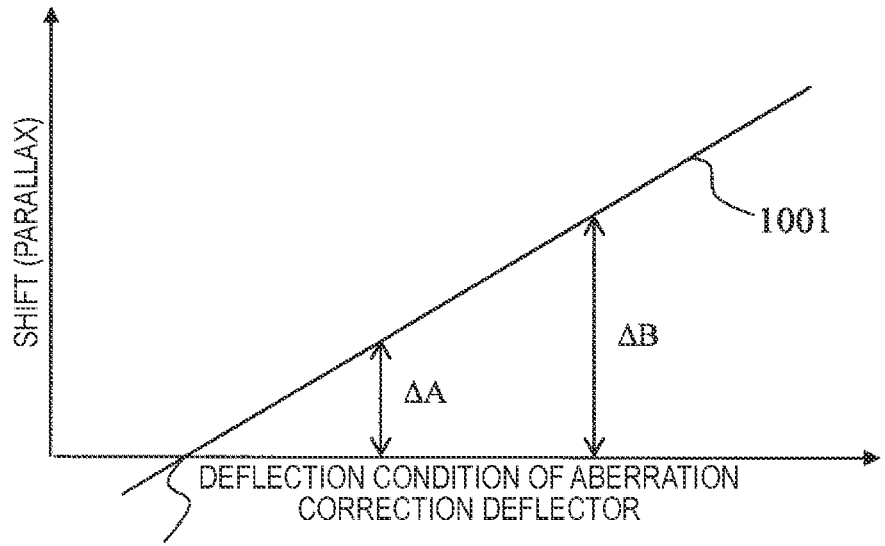
[FIG. 11]
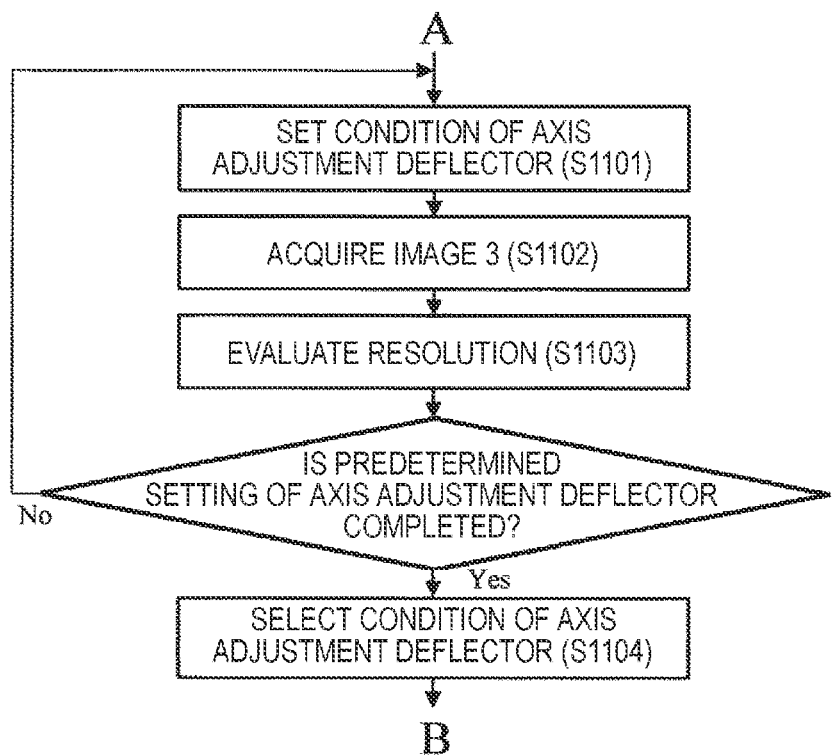

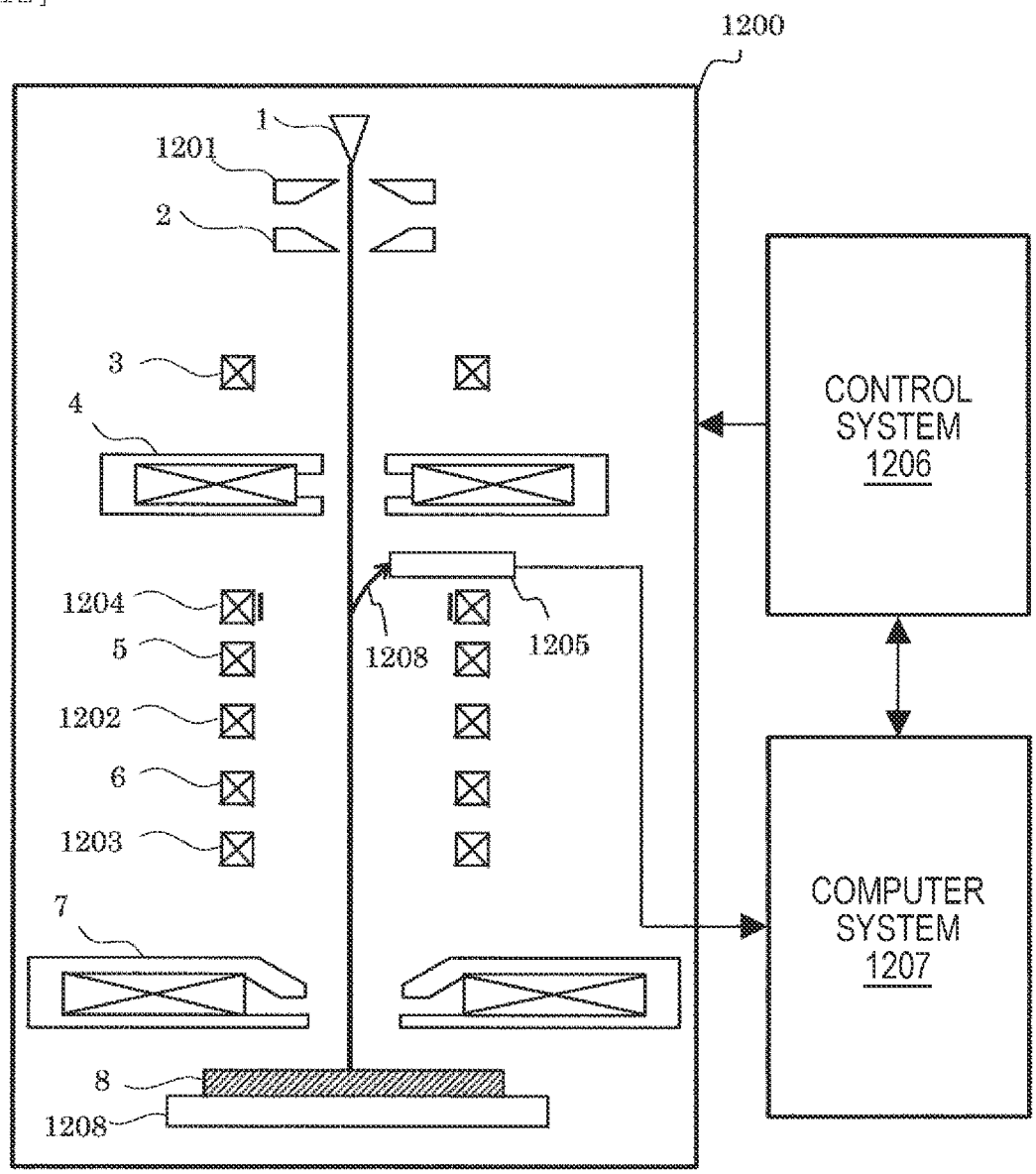
[FIG. 12]

[FIG. 13]
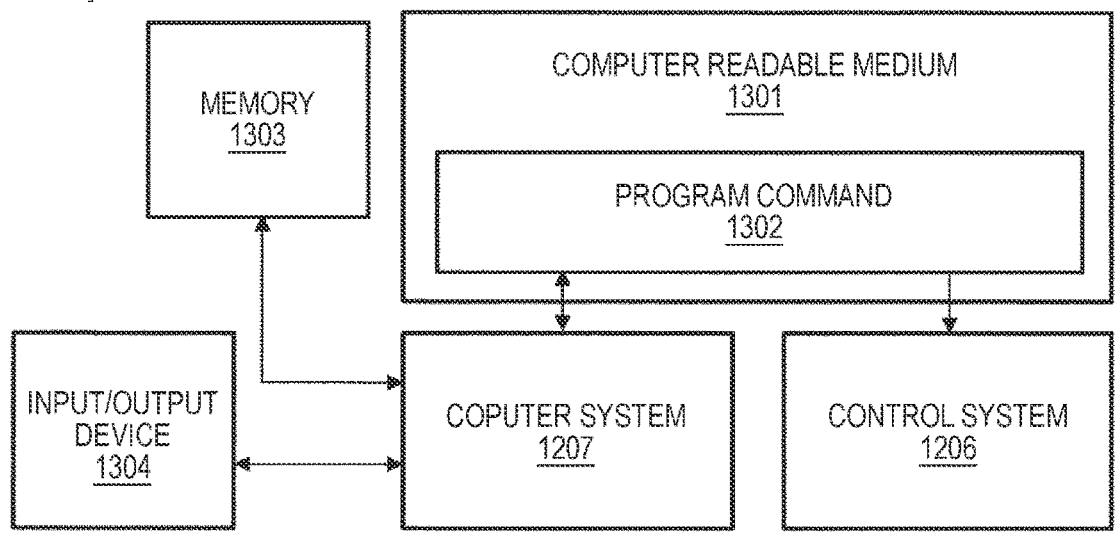

CHARGED PARTICLE BEAM APPARATUS

CROSS REFERENCE TO RELATED APPLICATIONS

This application is a divisional of U.S. application Ser. No. 16/782,521, filed Feb. 5, 2020, which claims priority from Japanese Patent Application No. 2019-043298, filed Mar. 11, 2019, the disclosures of which are expressly incorporated by reference herein.

TECHNICAL FIELD

The present disclosure relates to a charged particle beam apparatus, and more particularly to a charged particle beam apparatus capable of setting beam conditions when a plurality of points on a specimen are irradiated with a beam.

BACKGROUND ART

A charged particle beam apparatus such as a scanning electron microscope (SEM) is used for measuring and inspecting fine semiconductor device patterns. A scanning electron microscope is an apparatus that performs measurement and inspection using an image obtained by scanning a focused electron beam on a specimen. With recent advances in complexity and miniaturization of semiconductor devices, there is an increasing demand for more measurements and inspections in a shorter time. To improve the inspection speed, it is effective to shorten the time to image and the time to move a visual field.

There are two ways to move the visual field of SEM: stage movement to move the specimen position and image shift to move the irradiation position of the electron beam. Since the image shift electrically moves the visual field, the visual field can be moved faster and more accurately than the stage movement accompanied by a mechanical operation. However, if the electron beam is deflected for image shift, off-axis aberration of an objective lens is generated and the spatial resolution of the SEM is deteriorated, and thus the image shift is usually used only for minute movement of the visual field.

As a method for correcting off-axis aberration and expanding the usable range of image shift, there is a method for correcting off-axis chromatic aberration which is the most dominant aberration. As disclosed in JP-A-2014-053074 (PTL 1), for each point in the movable region of image shift, off-axis chromatic aberration can be corrected by adjusting an incident condition on an aberration corrector so that the shift of the irradiation position of the electron beam between two acceleration voltages is minimized.

JP-A-2010-251218 (PTL 2) discloses a technology that can reduce the number of repetitions required to complete correction by measuring off-axis chromatic aberration from the shift of the irradiation position of the electron beam between two acceleration voltages and performing correction based on this measurement result.

CITATION LIST

Patent Literature

PTL 1: JP-A-2014-053074
PTL 2: JP-A-2010-251218

SUMMARY OF INVENTION

Technical Problem

In order to suppress a reduction in spatial resolution during an image shift operation, it is necessary to correct off-axis chromatic aberration of the objective lens. As described in JP-A-2014-053074 and JP-A-2010-251218, this is possible by adjusting the incident condition on the aberration corrector so that the off-axis chromatic aberration is corrected at each point of the image shift.

However, in this means, the electron trajectory after passing through the aberration corrector changes due to the correction, and thus the incident angle of electrons with respect to the specimen changes. For this reason, the appearance of the semiconductor device pattern changes depending on the amount of image shift used, resulting in variations in inspection/measurement accuracy. In addition, when the electron trajectory after passing through the aberration corrector changes, the incident condition on the objective lens also changes, and thus the amount of aberration generated in the objective lens also changes. If correction is performed under such a situation, a very large number of repetitions are required until the aberration correction is completed, and thus an enormous adjustment time is required.

Hereinafter, a charged particle beam apparatus for the purpose of quickly finding a correction condition for new aberration that is generated as a result of beam adjustment will be described.

Solution to Problem

As one aspect for achieving the above object, there is proposed a charged particle beam apparatus configured to include an objective lens configured to focus a beam emitted from a charged particle source and irradiate a specimen, visual field movement deflectors configured to deflect an arrival position of the beam with respect to the specimen, and an aberration correction unit disposed between the visual field movement deflectors and the charged particle source, in which the aberration correction unit is configured to suppress a change in the arrival position of the beam irradiated under different beam irradiation conditions.

Further, as another aspect for achieving the above object, there is proposed a method or an apparatus for positioning a visual field at a desired position on a specimen by using a visual field movement deflector that changes an arrival position of a beam emitted from a charged particle source, the method or the apparatus including: deflecting the beam to a desired arrival position by using the visual field movement deflector, adjusting a deflection condition of the visual field movement deflector so as to cancel an inclination of an incident beam when the beam is deflected to the desired arrival position, and adjusting an aberration correction unit disposed between the charged particle source and the visual field movement deflector so as to cancel off-axis chromatic aberration generated according to an amount of visual field movement by the visual field movement deflector, off-axis chromatic aberration generated according to the amount of visual field movement, and off-axis chromatic aberration generated by setting the deflection condition of the visual field movement deflector so as to cancel the inclination of the incident beam.

Further, as still another aspect for achieving the above object, there is proposed a charged particle beam apparatus including an objective lens configured to focus a beam emitted from a charged particle source and irradiate a specimen, and a first lens disposed between the objective lens and the charged particle source, a second lens, a first deflector and a second deflector that deflect a beam passing through each lens, and a control device that controls the first lens, the second lens, the first deflector, and the second deflector, in which the control device generates off-axis chromatic aberration and off-axis coma aberration having the same amount as off-axis chromatic aberration and off-axis coma aberration generated by the objective lens, in a direction opposite to the off-axis chromatic aberration and off-axis coma aberration generated by the objective lens, by controlling the first lens, the second lens, the first deflector, and the second deflector.

Advantageous Effects of Invention

According to the above configuration, it is possible to quickly find a correction condition for new aberration that is generated as a result of beam adjustment.

BRIEF DESCRIPTION OF DRAWINGS

FIG. 1 is a diagram showing an outline of a charged particle beam apparatus including an aberration correction lens that corrects aberration when a visual field is moved and an aberration correction deflector.

FIG. 2 is a diagram showing an outline of the charged particle beam apparatus including a condenser lens between the aberration correction lens and an objective lens.

FIG. 3 is a diagram showing a trajectory of a beam when visual field movement (image shift) is performed off-axis of the objective lens by a visual field movement deflector.

FIG. 4 is a diagram showing a trajectory of a beam when an incident angle of the beam is inclined with respect to an optical axis without performing visual field movement by the visual field movement deflector.

FIG. 5 is a diagram showing an example of an electron beam trajectory used for correcting off-axis aberration.

FIG. 6 is a flowchart showing an adjustment process of the aberration correction deflector.

FIG. 7 is a flowchart showing the adjustment process of the aberration correction deflector.

FIG. 8 is a diagram showing an example of a deflection condition adjustment specimen of the aberration correction deflector.

FIG. 9 is a diagram showing a state of image shift that occurs when an acceleration voltage is changed in a state where the conditions of the aberration correction deflector are fixed.

FIG. 10 is a diagram showing a transition of shift according to a change in the conditions of the aberration correction deflector.

FIG. 11 is a flowchart showing an adjustment process of an axis adjustment deflector.

FIG. 12 is a diagram showing an outline of a scanning electron microscope.

FIG. 13 is a diagram showing an outline of a control system that controls the scanning electron microscope and a computer system that processes signals output from the scanning electron microscope.

DESCRIPTION OF EMBODIMENTS

Hereinafter, a charged particle beam apparatus having a function of correcting off-axis aberration will be described with reference to drawings. In the following description, a scanning electron microscope will be described as an example of one aspect of the charged particle beam apparatus, but application to other charged particle beam apparatuses such as a focused ion beam apparatus is also possible.

Example 1

FIG. 1 shows a scanning electron microscope capable of performing off-axis aberration correction while maintaining the incident angle of a beam with respect to a specimen. In the following description, a scanning electron microscope will be described as an aspect of a charged particle beam apparatus, but application to other charged particle beam apparatuses such as a focused ion beam apparatus is also possible.

As shown in FIG. 1, electrons extracted from an extraction electrode (not shown) from an electron source 1 are accelerated by an acceleration electrode 2 to become an electron beam. The electron beam is focused by an objective lens 7 and irradiated onto a specimen 8. In addition, the scanning electron microscope shown in FIG. 1 includes visual field movement deflectors (image shift deflector) 5 and 6 for moving the scanning position (visual field position) of the electron beam. Further, an aberration correction lens 4 and an aberration correction deflector 3 are provided for suppressing the influence of beam deflection by the visual field movement deflectors 5 and 6. The operation of these optical elements will be described later.

FIG. 12 is a diagram showing a more specific configuration of the scanning electron microscope shown in FIG. 1, and a diagram showing an example of an electron microscope system including a control system 1206 that controls a scanning electron microscope 1200 and a computer system 1207 that processes the obtained information.

Electrons extracted from the electron source 1 by an extraction electrode 1201 are accelerated by the acceleration electrode 2 and irradiated on the specimen 8. The specimen 8 is placed on a specimen stage 1208 that can move the specimen 8 at least in an x-y direction when the electron beam optical axis is in a z direction.

The electron beam reaching the specimen is scanned one-dimensionally or two-dimensionally on the specimen 8 by scanning deflectors 1202 and 1203. Signal electrons 1208 such as secondary electrons (SE) and backscattered electrons (BSE) are emitted from the specimen 8 by beam scanning. The signal electrons 1208 are guided off the optical axis of the electron beam by a signal electron deflection deflector 1204 and detected by a detector 1105 to generate a signal waveform and image data. For example, a scintillator is disposed on the detection surface of a detector 1205, and light generated by the scintillator is guided by a light guide or the like, converted again to electrons through a photomultiplier tube, and amplified into an electric signal. This electrical signal is sent to a display device or a frame memory (not shown) to be displayed or stored. Since the scanning of the display device and the scanning of the deflectors 1202 and 1203 are synchronized, a change in brightness according to the amount of signal electrons appears on the display device, and an SEM image is displayed.

Instead of the detector that directly detects signal electrons emitted from the specimen as a detector, a conversion electrode that generates secondary electrons by the collision of signal electrons may be disposed on the trajectory of the signal electrons, and a detector that pulls in and detects the secondary electrons converted by the conversion electrode may be employed.

Each component of the scanning electron microscope 1201 is controlled by the control system 1206. The control system 1206 controls each component of the scanning electron microscope according to a program command 1302 stored in a computer-readable medium 1301 shown in FIG. 13.

The scanning electron microscope 1200 is coupled to the computer system 1207 (computer subsystem) with one or more transmission media, and the output of the detector 1205 is transmitted to the computer system 1207 through the transmission medium as any appropriate output signal such as an electric signal, signal data, or image data. The output signal is processed according to at least one of the program commands 1302 and the processing command input from an input/output device 1304, and the processed data is stored in a memory 1303 and displayed on a display device (not shown) of the input/output device 1204.

The computer system can take a variety of forms including a personal computer system, an image computer, a mainframe computer system, a workstation, network equipment, internet equipment, or other equipment.

The control system 1206 executes the program command 1302 to set apparatus conditions according to the steps described below.

Hereinafter, an example in which off-axis aberration generated when the visual field is moved by the visual field movement deflector is corrected while maintaining the incident angle with respect to the specimen will be described with reference to FIG. 1 and the like. The primary electrons emitted from the electron source 1 are accelerated by the acceleration electrode 2 and then focused at the position on the object surface of the objective lens 7 by at least one condenser lens. Thereafter, the light is focused on the specimen 8 by the objective lens 7.

In order to perform image shift, primary electrons are deflected by at least two visual field movement deflectors 5 and 6. The visual field movement deflectors 5 and 6 are electrostatic or magnetic field deflectors disposed between the aberration correction lens 4 and the objective lens 7, and may be disposed in the electromagnetic field of the objective lens 7 and the aberration correction lens 4.

FIG. 1 shows an electron trajectory 100 in the case of perpendicular incidence with respect to the specimen 8. At this time, since the electron trajectory 100 passes off-axis of the objective lens 7, the spatial resolution is reduced due to the influence of off-axis aberration.

On the other hand, when the primary electrons are deflected by the aberration correction deflector 3 positioned immediately above the aberration correction lens 4 to change the incident condition on the aberration correction lens 4, off-axis aberration is also generated in the aberration correction lens 4. Thus, the combination of the aberration correction lens 4 and the aberration correction deflector 3 constitutes an aberration correction unit.

The aberration correction lens 4 may be a rotationally symmetric lens or may use a multipole element. By adjusting the current and voltage applied to the aberration correction deflector 3 so that the aberration correction lens 4 generates off-axis aberration that has the same magnitude as the off-axis aberration generated in the objective lens 7, in the opposite direction, the off-axis aberration generated in the objective lens 7 can be corrected.

The trajectory when the electron trajectory 100 is deflected by the aberration correction deflector 3 to correct the off-axis aberration with respect to the electron trajectory 100 that is perpendicularly incident on the specimen becomes an electron trajectory 101. Since the position of the electron trajectory 101 passing through the objective lens 7 is different from that of the electron trajectory 100, the amount of aberration generated in the objective lens 7 is also different. Therefore, in the electron trajectory 101, the correction is not complete and off-axis aberration remains.

In order to find an appropriate off-axis aberration correction condition, a sequence for adjusting the current and voltage applied to the aberration correction deflector 3 is repeated again. Further, in the electron trajectory 101, the incident angle of the primary electrons with respect to the specimen is changed from the perpendicular incidence, and the incident angle is changed and the image quality is changed with the use amount of the image shift.

Therefore, in the present embodiment, the condition of each optical element is adjusted so that the trajectory of the electron beam that has passed through the aberration correction lens 4 passes through the electron trajectory 102. The electron trajectory 102 shows the electron beam trajectory when appropriate off-axis aberration correction is performed. In the example of FIG. 1, the upper visual field movement deflector 5 is controlled, and the lower visual field movement deflector 6 performs deflection so as to return to the beam trajectory when the aberration correction using the aberration correction lens 4 is not performed. By making the incident condition on the objective lens 7 unchanged before and after the off-axis aberration correction, the number of repetitions until the correction is completed can be reduced, and the incident angle of the primary electrons to the specimen can be maintained. Hereinafter, a control method for realizing the electron trajectory 102 will be described.

Usually, at the time of using image shift, primary electrons are deflected by at least two visual field movement deflectors 5 and 6. At this time, if the current or voltage (deflection condition) to be supplied to the visual field movement deflector 5 is (Bx, By) and the deflection condition on the visual field movement deflector 6 is (Cx, Cy), these are given a relationship such as Equation 1.

$$\begin{bmatrix} Cx \\ Cy \end{bmatrix} = \begin{bmatrix} aUL & bUL \\ cUL & dUL \end{bmatrix} \begin{bmatrix} Bx \\ By \end{bmatrix} \qquad \text{[Equation 1]}$$

The coefficients (aUL, bUL, cUL, and dUL) are constants acquired by calculation and on an actual machine, and do not change unless the current and voltage applied to the objective lens 7 is changed. The method for determining the coefficients (aUL, bUL, cUL, and dUL) differs depending on the application of the SEM. For example, when high-resolution observation is performed, it is determined so that the primary electrons pass through the lens center of the objective lens 7, and in a case where it is desired to irradiate the specimen with a parallel beam, it is determined so that the primary electrons pass through the front focal position of the objective lens 7.

In addition, in the case of changing the negative voltage applied to the specimen 8 when changing the irradiation voltage to the specimen, it is preferable to determine so that primary electrons pass through the center of the electrostatic lens formed by the negative voltage applied to the specimen 8 in order to prevent the shift of a visual field at the time of changing the irradiation voltage.

In the present example, as shown in Equations 2 and 3, the deflection conditions (Bx, By) and (Cx, Cy) of the visual field movement deflectors 5 and 6 are determined from a deflection condition (Ax, Ay) of the aberration correction deflector 3 at the time of off-axis aberration correction. The coefficients (a, b, c, d, e, f, g, and h) may be obtained by calculation or may be acquired on the actual machine. As shown in Equations 2 and 3, the deflection conditions of the upper visual field movement deflector 5 and the lower visual field movement deflector are adjusted at a predetermined ratio.

$$\begin{bmatrix} Bx \\ By \end{bmatrix} = \begin{bmatrix} a & b \\ c & d \end{bmatrix} \begin{bmatrix} Ax \\ Ay \end{bmatrix}$$ [Equation 2]

$$\begin{bmatrix} Cx \\ Cy \end{bmatrix} = \begin{bmatrix} e & f \\ g & h \end{bmatrix} \begin{bmatrix} Ax \\ Ay \end{bmatrix}$$ [Equation 3]

The change of the electron trajectory by the aberration correction lens 4 when the primary electrons are deflected by the aberration correction deflector 3 is determined by the lens effect of the aberration correction lens 4. That is, when the magnification or angular magnification of the lens is applied to the off-axis amount and gradient of primary electrons at the position on the object surface of the lens, the off-axis amount and gradient of primary electrons on the image surface of the lens are obtained. This calculation is a linear calculation, and the trajectory change of primary electrons in free space is also expressed by a linear calculation. Therefore, there is a linear relationship between the deflection angle of the primary electrons by the aberration correction deflector 3 and the off-axis amount and gradient of the primary electrons at the position of the visual field movement deflector 5. Therefore, it is possible to keep the incident condition on the objective lens 7 unchanged during off-axis aberration correction by controlling the visual field movement deflectors 5 and 6 according to Equations 2 and 3 based on the current and voltage conditions applied to the aberration correction deflector 3.

When the voltage applied to the acceleration electrode 2 is changed with respect to the electron trajectory 100, a visual field shift occurs. This visual field shift is minimized by adjusting the current and voltage conditions applied to the aberration correction deflector 3 while maintaining the relationship of Equations 2 and 3.

According to such a control method, since the amount of off-axis chromatic aberration generated in the objective lens 7 does not change before and after applying the current and voltage to the aberration correction deflector 3, the incident angle with respect to the specimen is maintained, and correction can be completed with a very small number of repetitions of about 2 or 3 times.

With the above control, it is possible to reduce the number of repetitions of adjustment until off-axis aberration correction is completed, and to perform image shift while maintaining the incident angle of primary electrons on the specimen constant.

According to the present embodiment, the search for off-axis chromatic aberration correction conditions and the control of the incident angle of the electron beam with respect to the specimen can be performed independently. As a result, the number of repetitions required for searching for aberration correction conditions can be greatly reduced, and the adjustment time can be shortened.

A method for finding out the conditions of an aberration correction element (aberration correction deflector) according to a visual field movement condition will be described below. In the present example, an example will be described in which an appropriate control condition is found by adjusting an image shift trajectory in which off-axis chromatic aberration is corrected. FIG. 6 is a flowchart showing a process of finding an appropriate apparatus condition. In the present example, for example, an adjustment specimen 801 as shown in FIG. 8 is used to set conditions for the aberration correction deflector 3. For example, the adjustment specimen 801 is disposed on the specimen stage 1208, and the control system 1206 controls the sample stage 1208 so that the adjustment specimen 801 is positioned at the irradiation position of the electron beam when the aberration correction deflector 3 is adjusted.

The adjustment specimen 801 is provided with a plurality of adjustment patterns 802 arranged at known intervals. The adjustment pattern 802 is a cross pattern as shown in FIG. 9, for example, and is used to specify the shift amount in the x-y direction on the image.

The control system 1206 performs control as shown in FIG. 6 according to the program command 1302 stored in the computer-readable medium 1301 shown in FIG. 13. First, the specimen stage 1208 is controlled so that the center of the adjustment specimen 801 and the beam optical axis coincide with each other, and beam deflection is performed under a field movement condition for performing aberration correction (step 601). Then, beam deflection is performed by the aberration correction deflector 3 under a pre-registered deflection condition (step 602).

Next, the acceleration voltage applied to the acceleration electrode 2 is set to a condition 1, and an image 1 is formed by emitting an electron beam and two-dimensionally scanning the electron beam on the adjustment pattern 802 by using the scanning deflectors 1204 and 1205 (steps 603 and 604). Further, the acceleration voltage applied to the acceleration electrode 2 is set to a condition 2 different from the condition 1, and an image 2 is formed by emitting an electron beam and two-dimensionally scanning the electron beam on the adjustment pattern 802 by using the scanning deflectors 1204 and 1205 (steps 605 and 606).

The computer system 1207 calculates a shift between the patterns displayed in the image 1 and the image 2 by image processing (step 607), and in a case where the shift is other than zero or exceeds a predetermined value, the control system 1206 adjusts the conditions of the aberration correction deflector 3 so as to reduce the shift amount, and repeats the processing of steps 603 to 607 again. Also, the control system 1206 adjusts the deflection conditions of the visual field movement deflectors 5 and 6 so as to maintain the above ratio according to a change in the deflection condition (Ax, Ay) of the aberration correction deflector 3.

As a result of the above processing, the deflection condition (Ax, Ay) when the shift amount is zero or equal to or less than the predetermined value is stored as a deflection condition of the aberration correction deflector 3 for the set visual field movement condition in a predetermined storage medium (step 609).

By repeating the above processing for a combination of the visual field movement amount and the visual field movement direction to be subjected to aberration correction, it is possible to perform appropriate aberration correction for a plurality of field movement conditions.

FIG. 7 is a flowchart showing a process of finding a deflection condition of an appropriate aberration correction deflector, and shows a different example from FIG. 6. The same reference numerals are given to steps performing the same processing in FIG. 6. In the adjustment process shown in FIG. 7, as shown in FIG. 9, in the state of an aberration correction deflector condition A, in a case where it is determined that there is a shift between the image 1 and the image 2 in step 607, steps 603 to 607 are repeated with the aberration correction deflector condition set to a condition B (A+ΔA).

Based on the plurality of pieces of shift information obtained as described above, the deflection condition of the aberration correction deflector in which the shift is zero is calculated (step 702).

Here, a method for calculating a deflection condition using a plurality of pieces of shift information will be described. As shown in FIG. 10, from the shift amount ΔA in the condition A and the shift amount ΔB in the condition B, the coefficient (slope of straight line 1001 in the example of FIG. 10) included in the function having the shift amount and deflection condition as variables is obtained by using simultaneous equations, for example, and by using the function including the coefficient, the condition of the aberration correction deflector that does not cause image shift even when the acceleration voltage is changed is obtained. By performing such adjustment, it is possible to find out the proper conditions for the aberration correction deflector. In this example, for the sake of simplicity, an example in which only a shift in one direction is corrected has been described, but in a case where a beam is deflected, it is necessary to set conditions for the deflector for deflecting the beam in at least two directions based on the identification of the shift in at least two directions (shift in the x and y directions).

Example 2

Next, a charged particle beam apparatus including an optical system provided with a condenser lens 11 between the aberration correction lens 4 and the objective lens 7 will be described. In a case where the aberration generated in the aberration correction lens 4 is smaller than the aberration generated in the objective lens 7, the condenser lens 11 can be used to generate aberration for balancing these types of aberration. As shown in FIG. 2, an axis adjustment deflector 10 is disposed between the condenser lens 11 and the aberration correction lens 4.

When primary electrons are deflected by the aberration correction deflector 3 for correcting off-axis aberration, the primary electrons pass off the axis of the condenser lens 11 by the lens effect of the aberration correction lens 4. In this case, the trajectory of the primary electrons changes due to the lens effect of the condenser lens 11, and as a result, the incident condition on the objective lens 7 also change. Further, since the primary electrons pass off the axis of the condenser lens 11, an off-axis aberration is generated also in the condenser lens 11, which causes unintentional aberration.

In order to solve the above problem, a deflection condition (Dx, Dy) of an axis adjustment deflector 10 is determined based on the calculation of Equation 4 from the deflection condition (Ax, Ay) of the aberration correction deflector 3 applied during off-axis aberration correction, in addition to the interlocking control of Equations 2 and 3. The coefficients (i, j, k, and l) may be obtained by calculation or may be acquired on the actual machine.

$$\begin{bmatrix} Dx \\ Dy \end{bmatrix} = \begin{bmatrix} i & j \\ k & l \end{bmatrix} \begin{bmatrix} Ax \\ Ay \end{bmatrix}$$ [Equation 4]

If the coefficients (i, j, k, and l) are controlled so that the primary electrons pass through the center of the condenser lens 11, when the primary electrons are deflected by the aberration correction deflector 3, the generation of aberration in the condenser lens 11 can be suppressed, and the off-axis aberration can be generated only by the aberration correction lens 4. According to such control, even in a case where a different lens is disposed between the aberration correction lens 4 and the objective lens 7, it is possible to reduce the number of repetitions of adjustment until off-axis aberration correction is completed without causing extra aberration, and to perform image shift while maintaining the incident angle of primary electrons on the specimen constant.

A plurality of condenser lenses may be disposed between the aberration correction lens 4 and the objective lens 7, or an electrostatic lens or a magnetic field lens may be used. Further, it is possible to prevent the generation of extra aberration by performing the same control as in Equation 4 for each lens by disposing a deflector between the lenses.

Further, as shown in FIG. 2, if the coefficients (a, b, c, d, e, f, g, and h) for controlling the visual field movement deflectors 5 and 6 are determined so that the primary electrons passes through the center of the objective lens 7 and the electron trajectory is perpendicularly incident on the specimen, it is possible to obtain the electron trajectory 103 in which only the amount of aberration generated in the aberration correction lens 4 is different by changing the amount of deflection of the primary electrons by the aberration correction deflector 3. It is possible to verify variations in manufacturing and assembly of the aberration correction lens 4 and the aberration correction deflector 3 by measuring the amount of aberration in the electron trajectory 103.

FIG. 11 is a flowchart showing an adjustment process of the axis adjustment deflector 10. The flowchart shown in FIG. 11 is executed after step 609 of FIG. 6, for example. First, the control system 1206 changes the condition (Dx, Dy) of the axis adjustment deflector 10 to acquire an image 3 (steps 1101 and 1102). At this time, (Bx, By)(Cx, Cy) is also adjusted by linear calculation in accordance with the change of (Dx, Dy). In this adjustment, (Ax, Ay)(Bx, By)(Cx, Cy)(Dx, Dy) determined through the process of FIG. 6 and (Ax, Ay)(Bx, By)(Cx, Cy)(Dx, Dy) to be determined in the processing of FIG. 11 are superimposed to determine (Ax, Ay)(Bx, By)(Cx, Cy)(Dx, Dy) in FIG. 11. Further, resolution evaluation is performed on the acquired image 3 (step 1103). For the resolution evaluation, for example, it is possible to adopt a technique of obtaining image resolution from frequency analysis by two-dimensional Fourier transform (FFT). The computer system 1207 evaluates the resolution of the image 3 by executing an image processing algorithm for resolution evaluation stored in advance in the memory 1303 or the like.

The control system 1206 repeatedly executes steps 1101 to 1103 for predetermined (plurality of) axis adjustment deflector conditions, and sets the resolution of the axis adjustment deflector 10 to be the maximum or a predetermined value or more, and then returns to step 603 in FIG. 6. Then, the processing in steps 603 to 609 is performed again. This loop is executed a plurality of times to find a combination of the aberration correction deflector 3 and the axis adjustment deflector 10 in which both the shift amount and the resolution satisfy predetermined conditions. In this case, after step 609 in FIG. 6, in a case where resolution evaluation is performed and the resolution satisfies the predetermined condition, it is determined whether or not the adjustment at a predetermined visual field movement position has been completed without transitioning to the processing of FIG. 11, and in a case where the adjustment has been completed, the adjustment is ended.

It is possible to set the conditions of the aberration correction deflector 3 and the axis adjustment deflector 10 appropriately by performing the processing as described above.

In the above description, the example in which the condition of the axis adjustment deflector 10 is set based on the resolution evaluation has been described, but the present invention is not limited thereto, and the conditions of the axis adjustment deflector 10 may be set based on other image quality evaluation index values such as image contrast and contrast noise ratio.

Example 3

A means for independently controlling the incident angle of the primary electrons on the specimen, the amount of off-axis chromatic aberration, and the amount of visual field movement due to image shift will be described. First, each electron trajectory used for control will be described.

The electron trajectory 103 shown in FIG. 2 is a trajectory that is perpendicular to the specimen surface (parallel to the optical axis of the objective lens) and has no visual field movement. In the electron trajectory 103, when the primary electrons are deflected by the aberration correction deflector 3, the current and voltage applied to the visual field movement deflectors 5 and 6 and the axis adjustment deflector 10 are controlled based on the above-described Equations 2, 3, and 4 so as not to change the incidence condition on the objective lens 7. In the electron trajectory 103, there is a relationship of Equation 5 between the deflection condition (Ax, Ay) of the aberration correction deflector 3 and the amount Crcd=(Crcdx, Crcdy) of off-axis chromatic aberration generated on the specimen. The coefficients (aCA, bCA, cCA, and dCA) are determined from the focusing conditions of the aberration correction lens 4 (excitation current for an electromagnetic lens and applied voltage for an electrostatic lens) and focusing conditions of the condenser lens 3 and the objective lens 7. Alternatively, the amount of off-axis chromatic aberration can be measured by measuring the amount of visual field movement when the voltage applied to the acceleration electrode 2 is changed, and each coefficient may be determined from the result.

$$\begin{bmatrix} Crcdx \\ Crcdy \end{bmatrix} = \begin{bmatrix} aCA & bCA \\ cCA & dCA \end{bmatrix} \begin{bmatrix} Ax \\ Ay \end{bmatrix} \quad \text{[Equation 5]}$$

The electron trajectory 104 shown in FIG. 3 is a beam trajectory when visual field movement (image shift) is performed off-axis by the visual field movement deflectors 5 and 6. The electron trajectory 104 may be perpendicularly incident on the specimen, or the incident angle may be changed according to the image shift amount as in the case where the center of the objective lens 7 is used as a deflection fulcrum. The deflection conditions of the visual field movement deflectors 5 and 6 are determined based on Equation 1. Further, the amount IS=(ISx, ISy) of visual field movement by the image shift and the deflection condition (Cx, Cy) of the visual field movement deflector 6 have a linear relationship shown in Equation 6. The coefficients (am, bm, cm, and dm) are determined from the focusing condition of the objective lens 7 and Equation 1.

$$\begin{bmatrix} ISx \\ ISy \end{bmatrix} = \begin{bmatrix} am & bm \\ cm & dm \end{bmatrix} \begin{bmatrix} Cx \\ Cy \end{bmatrix} \quad \text{[Equation 6]}$$

Since the electron trajectory 104 passes off the axis of the objective lens 7, off-axis aberration is generated. There are relationships of Expressions 7 and 8 between the amount IS=(ISx, ISy) of visual field movement, the incident angle $\theta=(\theta x, \theta y)$, and the amount rcd=(rcdx, rcdy) of off-axis chromatic aberration. The coefficients (aT, bT, cT, dT, aA, bA, cA, and dA) are determined based on the focusing condition of the objective lens 7 and Equation 1. Alternatively, the coefficient (aT, bT, cT, and dT) may be acquired on the actual machine by using any means for measuring the incident angle with respect to the specimen. Further, the coefficients (aA, bA, cA, and dA) may be acquired on the actual machine by measuring the amount of visual field movement when the voltage applied to the acceleration electrode 2 is changed and calculating the amount of off-axis chromatic aberration.

$$\begin{bmatrix} \theta x \\ \theta y \end{bmatrix} = \begin{bmatrix} aT & bT \\ cT & dT \end{bmatrix} \begin{bmatrix} ISx \\ ISy \end{bmatrix} \quad \text{[Equation 7]}$$

$$\begin{bmatrix} rcdx \\ rcdy \end{bmatrix} = \begin{bmatrix} aA & bA \\ cA & dA \end{bmatrix} \begin{bmatrix} ISx \\ ISy \end{bmatrix} \quad \text{[Equation 8]}$$

The electron trajectory 105 shown in FIG. 4 is a trajectory when the incident angle of the beam is tilted with respect to the optical axis without moving the visual field. In FIG. 4, the trajectory in the case where the object surface of the objective lens 7 is located at the position of the visual field movement deflector 6 is shown. Even if the object surface position of the objective lens 7 is different, similar to the electron trajectory 105, it is possible to obtain an electron trajectory without visual field movement by determining the upper/lower ratio of the visual field movement deflectors 5 and 6 to be the rocking condition for the objective lens 7.

Since the electron trajectory 105 passes off the axis of the objective lens 7, off-axis aberration is generated. The incident angle $C\theta=(C\theta x, C\theta y)$ and the amount Trcd=(Trcdx, Trcdy) of off-axis chromatic aberration of the electron trajectory 105 and the deflection condition (Cx, Cy) of the visual field movement deflector 6 have the relationship of Equations 9 and 10.

The coefficients (aTC, bTC, cTC, dTC, aTA, bTA, cTA, and dTA) are determined from the focusing condition of the objective lens 7. Alternatively, the coefficient (aTC, bTC, cTC, and dTC) may be acquired on the actual machine using a means for measuring the incident angle with respect to the specimen. In this case, for example, it is conceivable that an image before tilting, that is, a top-down image and an image after tilting, that is, a tilted image is obtained by using a specimen having a known pyramid shape, and the tilted angle of the electron beam is obtained by image processing.

Further, the coefficients (aTA, bTA, cTA, and dTA) may be acquired on the actual machine by measuring the amount of visual field movement when the voltage applied to the acceleration electrode 2 is changed and calculating the amount of off-axis chromatic aberration.

$$\begin{bmatrix} C\theta x \\ C\theta y \end{bmatrix} = \begin{bmatrix} aTC & bTC \\ cTC & dTC \end{bmatrix} \begin{bmatrix} Cx \\ Cy \end{bmatrix} \quad \text{[Equation 9]}$$

$$\begin{bmatrix} Trcdx \\ Trcdy \end{bmatrix} = \begin{bmatrix} aTA & bTA \\ cTA & dTA \end{bmatrix} \begin{bmatrix} Cx \\ Cy \end{bmatrix}$$ [Equation 10]

The procedure for obtaining an electron trajectory with corrected perpendicular incidence and off-axis chromatic aberration by using the above three types of electron trajectories will be described below. First, the visual field is moved by the electron trajectory 104. Next, the trajectory of the electron trajectory 105 is added so as to cancel the incident angle=(θx, θy) of the electron trajectory 104. That is, the deflection condition of the visual field movement deflector 6 is adjusted so that Cθ=(Cθx, Cθy)=(−θx,−θy).

Next, the electron trajectory 103 is added so as to cancel the amount rcd+Trcd=(rcdx+Trcdx, rcdy+Trcdy) of off-axis chromatic aberration generated in the electron trajectories 104 and 105. In other words, the aberration correction deflector 3, the visual field movement deflectors 5 and 6 and the axis adjustment deflector 10 are controlled so that Crcd=(Crcdx, Crcdy)=(−(rcdx+Trcdx), −(rcdy+Trcdy)).

From the above, the deflection conditions of each deflector are determined based on the following Equations 11, 12, 13, and 14. As an operation performed on the actual apparatus, first, the amount IS=(ISx, ISy) of visual field movement by the image shift is input, and based on the input, the deflection condition (Ax, Ay) of the aberration correcting deflector 3 are determined based on Equation 11. Further, the deflection conditions of the visual field movement deflectors 5 and 6 and the axis adjustment deflector 10 are determined based on the inputs of IS and (Ax, Ay) to Equations 12, 13, and 14.

$$\begin{bmatrix} Ax \\ Ay \end{bmatrix} = \begin{bmatrix} aCA & bCA \\ cCA & dCA \end{bmatrix}$$ [Equation 11]

$$\left\{ \begin{bmatrix} aA & bA \\ cA & dA \end{bmatrix} - \begin{bmatrix} aTA & bTA \\ cTA & dTA \end{bmatrix} \begin{bmatrix} aTC & bTC \\ cTC & dTC \end{bmatrix}^{-1} \begin{bmatrix} aT & bT \\ cT & dT \end{bmatrix} \right\} \begin{bmatrix} ISx \\ ISy \end{bmatrix}$$

$$\begin{bmatrix} Bx \\ By \end{bmatrix} = \begin{bmatrix} aUL & bUL \\ cUL & dUL \end{bmatrix}^{-1} \begin{bmatrix} am & bm \\ cm & dm \end{bmatrix}^{-1} \begin{bmatrix} ISx \\ ISy \end{bmatrix} + \begin{bmatrix} a & b \\ c & d \end{bmatrix} \begin{bmatrix} Ax \\ Ay \end{bmatrix}$$ [Equation 12]

$$\begin{bmatrix} Cx \\ Cy \end{bmatrix} = \left\{ \begin{bmatrix} am & bm \\ cm & dm \end{bmatrix}^{-1} - \begin{bmatrix} aTC & bTC \\ cTC & dTC \end{bmatrix}^{-1} \begin{bmatrix} aT & bT \\ cT & dT \end{bmatrix} \right\} \begin{bmatrix} ISx \\ ISy \end{bmatrix} + \begin{bmatrix} e & f \\ g & h \end{bmatrix} \begin{bmatrix} Ax \\ Ay \end{bmatrix}$$ [Equation 13]

$$\begin{bmatrix} Dx \\ Dy \end{bmatrix} = \begin{bmatrix} i & j \\ k & l \end{bmatrix} \begin{bmatrix} Ax \\ Ay \end{bmatrix}$$ [Equation 14]

The above-described interlocking control of the deflector enables an image shift by an electron trajectory in which perpendicular incidence and off-axis chromatic aberration are corrected. In addition, if an offset of the incident angle θoffset=(θxoffset, θyoffset) is added to the obtained trajectory by the electron trajectory 105, and the off-axis chromatic aberration generated at that time is canceled by the electronic trajectory 103, image shift can be performed at an arbitrary incident angle.

In addition, when the adjustment of each trajectory is different from the ideal state, for example, in a state where there is a minute change in the incident angle and visual field movement in the electron trajectory 103 and in a state where there is a minute visual field movement in the electron trajectory 105, in one time of adjustment, off-axis chromatic aberration may remain, or the electron trajectory may have an incident angle shifted from a desired value.

In that case, the amount of remaining off-axis chromatic aberration is measured by measuring the amount of visual field movement when the voltage applied to the acceleration electrode 2 is changed in a state where the control based on Equations 11, 12, 13, and 14 is performed, and the amount of off-axis chromatic aberration can be reduced by adding the electron trajectory 103 again based on the measurement result. Even when the incident angle is shifted, the incident angle is measured by a means for measuring the incident angle with respect to the specimen, and based on the result, the incident angle can be close to a desired value by adding the electron trajectory 105. By repeating such a sequence, a desired electron trajectory can be obtained.

Example 4

In addition to the control of Example 3, FIG. 5 shows an electron trajectory 106 newly added to simultaneously correct two types of off-axis aberration among the off-axis aberration generated in the objective lens 7 during image shift. The off-axis aberration generated in the objective lens 7 is not limited to the off-axis chromatic aberration, and other types of aberration may also be generated, which may cause resolution deterioration. Hereinafter, a means for simultaneously correcting off-axis chromatic aberration and off-axis coma aberration will be described by taking off-axis coma aberration as an example of the second type of off-axis aberration. In the present example, a charged particle beam apparatus including a plurality of (two or more) aberration generating lenses and a deflector that deflects a beam passing through the aberration generating lens will be described as an example.

The electron trajectory 106 is controlled by the axis adjustment deflector 10 (second deflector) so as to pass off the axis of the condenser lens 11 (second lens). At this time, off-axis chromatic aberration and off-axis coma aberration are generated in the condenser lens 11. The generation direction and amount of off-axis chromatic aberration and off-axis coma aberration are determined from the applied current and voltage of the condenser lens 11 and the applied current and voltage of the axis adjustment deflector 10. In addition, the applied currents and voltages of the visual field movement deflectors 5 and 6 are determined from the applied current and voltage of the axis adjustment deflector 10 by linear calculation in order not to change the incident condition on the objective lens 7 after the beam passes through the condenser lens 11.

In the electron trajectory 103, off-axis chromatic aberration and off-axis coma aberration are generated in the aberration correction lens 4 (first lens) due to deflection by the aberration correction deflector 3 (first deflector). The direction and amount of off-axis chromatic aberration and off-axis coma aberration are determined from the applied current and voltage of the aberration correction lens 4 and the applied current and voltage of the axis adjustment deflector 10.

In general, the generation direction and generation amount of off-axis chromatic aberration and off-axis coma aberration generated in the electron trajectory 103 and the electron trajectory 106 are different. Therefore, by adding these electron trajectories, an electron trajectory in which only off-axis chromatic aberration is generated or an electron trajectory in which only off-axis coma aberration is generated can be obtained.

The off-axis chromatic aberration and off-axis coma generated in the objective lens 7 are determined by the incidence condition on the objective lens 7. Therefore, the off-axis chromatic aberration and off-axis coma aberration of the objective lens 7 can be corrected simultaneously by adding these electron trajectory 103 and electron trajectory 106 together and controlling the generation direction and generation amount of the total off-axis chromatic aberration and the total off-axis coma aberration generated in the aberration correction lens 4 and the condenser lens 11 to be the same generation amount in the opposite direction to the off-axis chromatic aberration and off-axis coma aberration generated in the objective lens 7.

REFERENCE SIGNS LIST

1: electron source
2: acceleration electrode
3: aberration correction deflector
4: aberration correction lens
5: visual field movement deflector
6: visual field movement deflector
7: objective lens
8: specimen
10: axis adjustment deflector
11: condenser lens
100: electron trajectory before correction of off-axis aberration
101: electron trajectory after correction of off-axis aberration
102: electron trajectory after correction of off-axis aberration
103: electron trajectory that causes only off-axis aberration
104: electron trajectory that moves visual field
105: electron trajectory that changes incident angle
106: electron trajectory that causes only off-axis aberration

The invention claimed is:

1. A method of positioning a visual field at a desired position on a specimen by using a visual field movement deflector that changes an arrival position of a beam emitted from a charged particle source, the method comprising:
deflecting the beam to a desired arrival position by using the visual field movement deflector;
adjusting a deflection condition of the visual field movement deflector so as to cancel an inclination of an incident beam when the beam is deflected to the desired arrival position; and,
obtaining an amount of off-axis chromatic aberration generated according to an amount of visual field movement by the visual field movement deflector and an amount of off-axis chromatic aberration generated by setting the deflection condition of the visual field movement deflector so as to cancel the inclination of the incident beam, and adjusting an aberration correction unit disposed between the charged particle source and the visual field movement deflector so as to generate an amount of off-axis chromatic aberration that cancels the off-axis chromatic aberrations by the visual field movement deflector.

2. A charged particle beam apparatus comprising:
an objective lens configured to focus a beam emitted from a charged particle source and irradiate a specimen;
a visual field movement deflector configured to deflect an arrival position of the beam with respect to the specimen;
an aberration correction unit disposed between the visual field movement deflector and the charged particle source; and
a control device configured to control the visual field movement deflector and the aberration correction unit,
wherein the control device is configured to
deflect the beam to a desired arrival position by using the visual field movement deflector,
adjust a deflection condition of the visual field movement deflector so as to cancel an inclination of an incident beam when the beam is deflected to the desired arrival position,
obtain an amount of off-axis chromatic aberration generated according to an amount of visual field movement by the visual field movement deflector and an amount of off-axis chromatic aberration generated by setting the deflection condition of the visual field movement deflector so as to cancel the inclination of the incident beam, and
adjust the aberration correction unit so as to generate an amount of off-axis chromatic aberration that cancels the off-axis chromatic aberrations by the visual field movement deflector.

3. A charged particle beam apparatus comprising:
an objective lens configured to focus a beam emitted from a charged particle source and irradiate a specimen; and
a first lens disposed between the objective lens and the charged particle source;
a second lens;
a first deflector and a second deflector that deflect a beam passing through each lens; and
a control device configured to control the first lens, the second lens, the first deflector, and the second deflector,
wherein the control device is configured to generate off-axis chromatic aberration and off-axis coma aberration having the same amount as off-axis chromatic aberration and off-axis coma aberration generated by the objective lens, in a direction opposite to the off-axis chromatic aberration and off-axis coma aberration generated by the objective lens, in the first lens and the second lens by controlling the first deflector and the second deflector.

* * * * *